(12) United States Patent
Ilango et al.

(10) Patent No.: US 9,584,082 B1
(45) Date of Patent: Feb. 28, 2017

(54) SYSTEMS AND METHODS FOR SUPPLY-BASED GAIN CONTROL OF AN AUDIO OUTPUT SIGNAL

(71) Applicant: Cirrus Logic, Inc., Austin, TX (US)

(72) Inventors: Anand Ilango, Austin, TX (US); Aniruddha Satoskar, Austin, TX (US); Bharath Kumar Thandri, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 345 days.

(21) Appl. No.: 14/028,769

(22) Filed: Sep. 17, 2013

(51) Int. Cl.
*H03G 3/00* (2006.01)

(52) U.S. Cl.
CPC ................... *H03G 3/007* (2013.01)

(58) Field of Classification Search
CPC ....................................................... H03G 3/007
USPC .... 381/82, 99, 107, 110; 348/571, 576, 580, 348/687; 370/342
See application file for complete search history.

(56) References Cited

U.S. PATENT DOCUMENTS

| | | | |
|---|---|---|---|
| 2002/0131607 A1* | 9/2002 | Belenger et al. | 381/110 |
| 2006/0158558 A1* | 7/2006 | Chung | 348/576 |
| 2007/0140204 A1* | 6/2007 | Thorson et al. | 370/342 |

* cited by examiner

*Primary Examiner* — Md S Elahee
(74) *Attorney, Agent, or Firm* — Jackson Walker L.L.P.

(57) ABSTRACT

An audio device may include an electrical terminal for coupling a transducer device to the audio device and an audio circuit for generating an analog audio signal coupled to the electrical terminal. The audio circuit may include a pre-amplifier stage, an amplifier, and a gain selector. The pre-amplifier stage may apply a selectable gain to an audio input signal to generate a pre-amplified analog audio signal, wherein the pre-amplifier stage is powered by a first power supply. The amplifier may amplify the pre-amplified analog audio signal to generate the analog audio signal, wherein the amplifier is powered from a second power supply isolated from the first power supply. The gain selector may select the selectable gain based on a level of the first power supply, such that a difference between the second power supply and the analog audio signal is more than a predetermined headroom threshold voltage.

18 Claims, 2 Drawing Sheets

SYSTEMS AND METHODS FOR SUPPLY-BASED GAIN CONTROL OF AN AUDIO OUTPUT SIGNAL

FIELD OF DISCLOSURE

The present disclosure relates in general to circuits for audio devices, including without limitation, personal audio devices such as wireless telephones and media players, and more specifically, to systems and methods that vary the gain of an audio output signal path based on a supply voltage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuits often include a power amplifier for driving an audio output signal to the headphones or speakers, wherein the power amplifier itself is driven by a pre-amplifier (e.g., a digital-to-analog converter). In many implementations, the pre-amplifier and the power amplifier are supplied from different, isolated power supplies.

In such scenarios, the amplitude of an audio output signal may be directly proportional to the power supply of the pre-amplifier, and may thus vary as the power supply of the pre-amplifier varies (e.g., due to noise or other parasitic effects affecting the power supply). Because the power supply of the power amplifier is uncorrelated from the amplitude of the pre-amplifier output signal driving the power amplifier, conditions may from time to time exist in which the power amplifier power supply does not provide enough voltage headroom for the audio signal, leading to clipping or other distortion of the audio signal.

SUMMARY

In accordance with the teachings of the present disclosure, the disadvantages and problems associated with existing approaches to driving audio output signals may be reduced or eliminated.

In accordance with embodiments of the present disclosure, an audio device may include an electrical terminal for coupling a transducer device to the audio device and an audio circuit for generating an analog audio signal, wherein the analog audio signal is coupled to the electrical terminal. The audio circuit may include a pre-amplifier stage, an amplifier, and a gain selector. The pre-amplifier stage may apply a selectable gain to an audio input signal to generate a pre-amplified analog audio signal, wherein the pre-amplifier stage is powered by a first power supply. The amplifier may amplify the pre-amplified analog audio signal to generate the analog audio signal, wherein the amplifier is powered from a second power supply isolated from the first power supply. The gain selector may select the selectable gain based on a level of the first power supply, such that a difference between a magnitude of the second power supply and a magnitude of the analog audio signal is more than a predetermined headroom threshold voltage.

In accordance with these and other embodiments of the present disclosure, a method may include applying, by a pre-amplifier stage powered by a first power supply, a selectable gain to an audio input signal to generate a pre-amplified analog audio signal. The method may also include amplifying, by an amplifier powered from a second power supply isolated from the first power supply, the pre-amplified analog audio signal to generate an analog audio signal. The method may further include selecting the selectable gain based on a level of the first power supply, such that a difference between a magnitude of the second power supply and a magnitude of the analog audio signal is more than a predetermined headroom threshold voltage.

In accordance with these and other embodiments of the present disclosure, an integrated circuit may include a pre-amplifier stage, an amplifier, and a gain selector. The pre-amplifier stage may apply a selectable gain to an audio input signal to generate a pre-amplified analog audio signal, wherein the pre-amplifier stage is powered by a first power supply. The amplifier may amplify the pre-amplified analog audio signal to generate an analog audio signal coupled to an electrical terminal for coupling a transducer device to the integrated circuit, wherein the amplifier is powered from a second power supply isolated from the first power supply. The gain selector may select the selectable gain based on a level of the first power supply, such that a difference between a magnitude of the second power supply and a magnitude of the analog audio signal is more than a predetermined headroom threshold voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
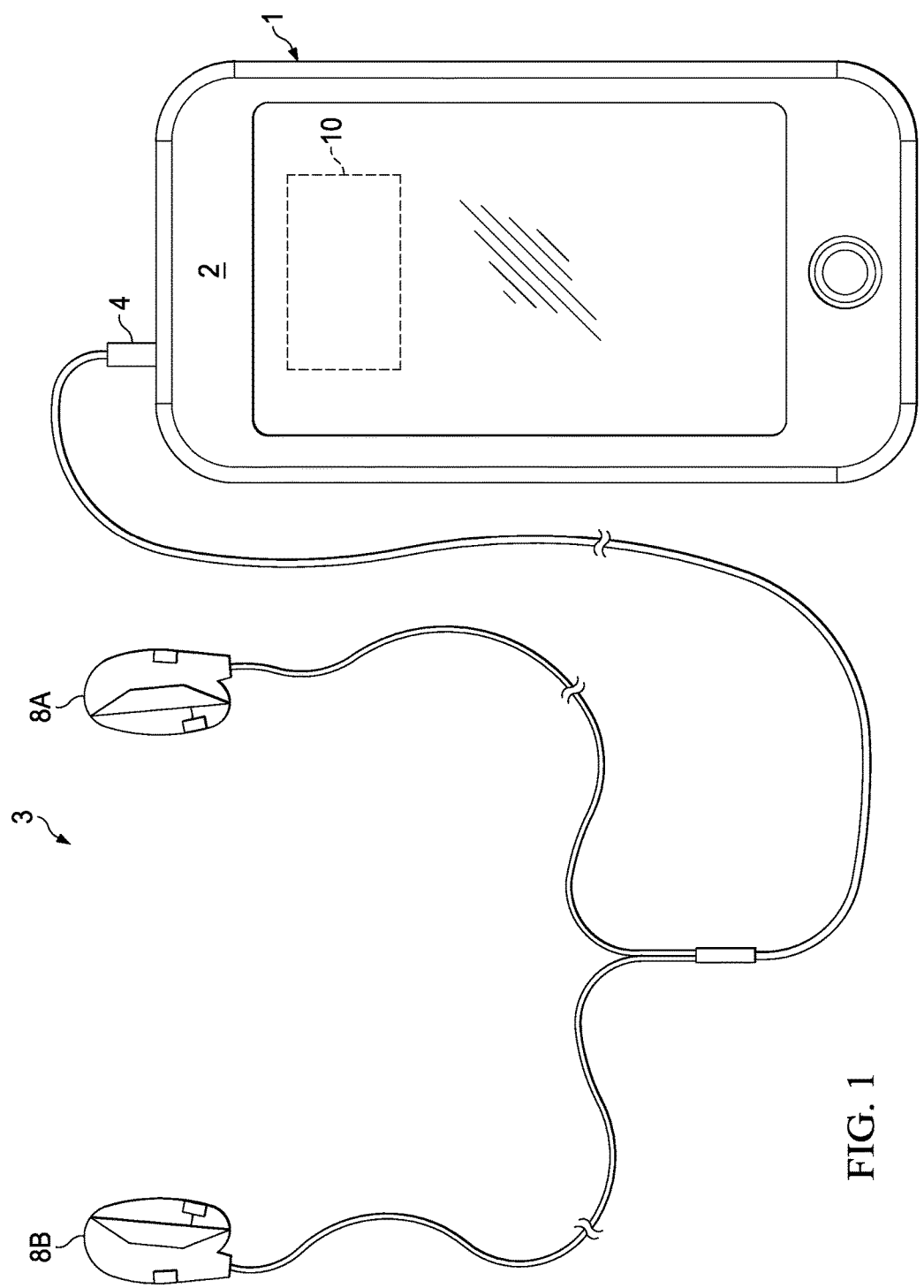
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 10 for generating an analog audio signal for transmission to headset 3 and/or another audio transducer.

Figure 2:
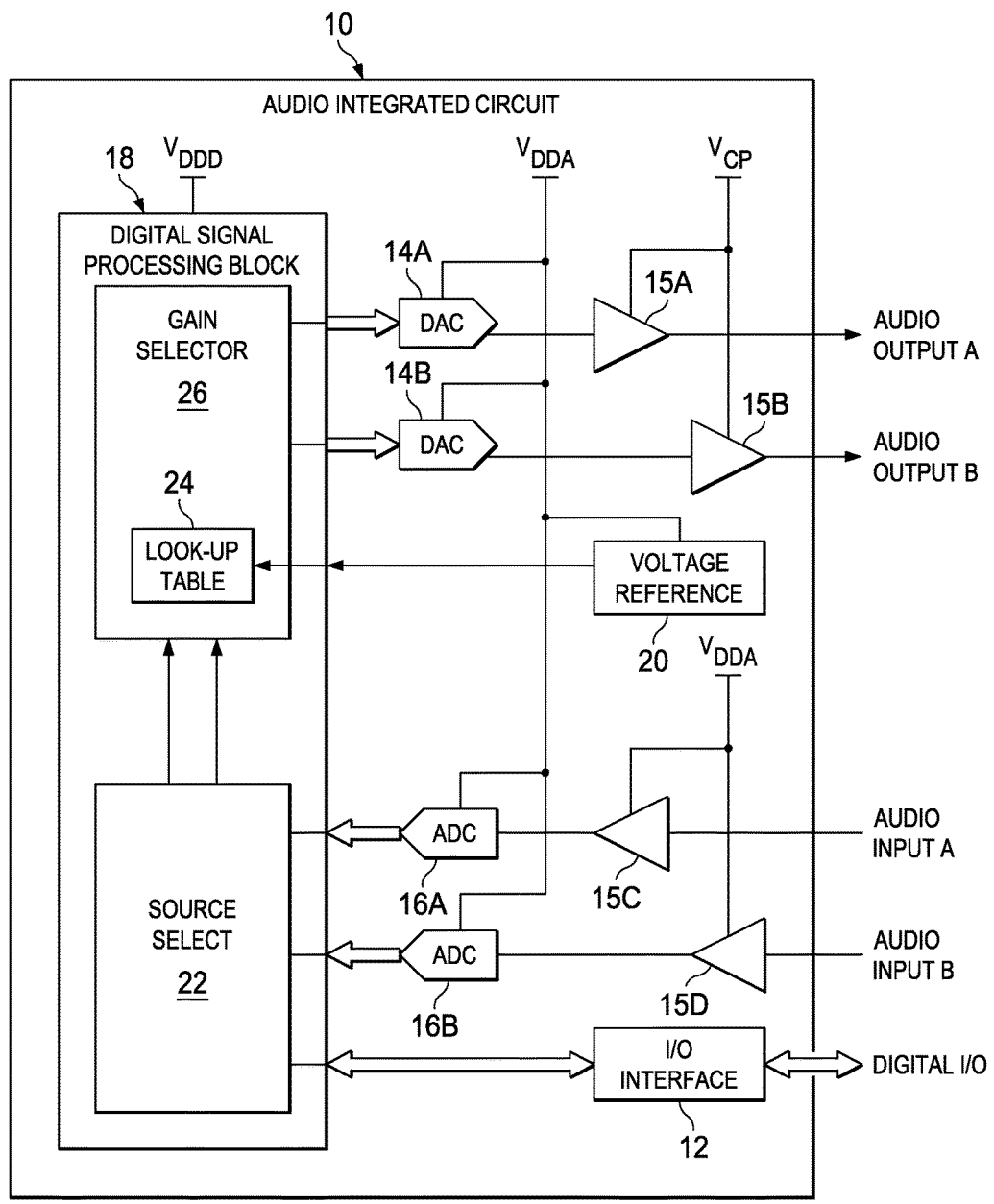
FIG. 2 is a block diagram of an audio integrated circuit for use within the personal audio device depicted in FIG. 1 and other devices, in accordance with embodiments of the present disclosure.

FIG. 2 is a block diagram of audio IC 10 for use within the personal audio device depicted in FIG. 1 and/or other devices, in accordance with embodiments of the present disclosure. Audio IC 10 may include a digital signal processing block 18 that is coupled to audio output A and audio output B via digital to analog converters (DACs) 14A-14B that provide inputs to corresponding amplifiers 15A-15B. Each of audio output A and audio output B may be configured to couple to headset 3 and/or other audio transducer (e.g., an audio transducer plugged into personal audio device 1). As shown in FIG. 1, DACs 14A-14B may be supplied with electrical energy from a power supply $V_{DDA}$, while amplifiers 15A-15B may be supplied from a power supply $V_{CP}$ isolated from supply $V_{DDA}$.

Digital signal processing block 18 may also be coupled to audio input A and audio input B by analog-to-digital converters (ADCs) 16A-16B and corresponding amplifiers 15C-15D. An input/output (I/O) interface 12 may provide for connection of audio IC 10 to a larger processing system through interface digital I/O.

As depicted in FIG. 2, digital signal processing block 18 may include source select 22 and a gain selector 26. Source select 22 may select between various audio sources (e.g. audio input A/audio input B and digital I/O) and transmit audio signals associated with the selected source to gain selector 26, for ultimate transmission to audio output A and audio output B. Gain selector 26 may comprise any system, device, or apparatus for receiving a voltage reference signal indicative of the power supply voltage $V_{DDA}$ for DACs 14A-14B, and based on such power supply voltage, selecting and applying a gain (e.g., a digital gain) to the audio signal received from source select 22. In some embodiments, gain selector 26 may select the selectable gain from a finite plurality of possible selectable digital gains. In these and other embodiments, gain selector 26 may include a look-up table 24 comprising any array or other data structure for performing an indexing operation whereby the level of the power supply $V_{DDA}$ or a value indicative of the level of the power supply $V_{DDA}$ is an input or index to look-up table 24 and the selectable gain or a value indicative of the selectable gain is an output of look-up table 24 based on the input. Each entry in look-up table 24 may be such that for the particular level of power supply $V_{DDA}$ of the entry, the corresponding selected gain, when applied to the audio signal path, ensures that audio output signal A and audio output signal B have adequate voltage headroom relative to power supply $V_{CP}$. For instance, a corresponding selected gain may ensure that, for its corresponding level of power supply $V_{DDA}$, the differences between the magnitude of power supply $V_{CP}$ and each of the magnitudes of audio output A and audio output B are each more than a headroom threshold voltage (e.g., a threshold voltage selected by a designer of audio IC 10 to be large enough that clipping of audio output A and audio output B by power supply $V_{CP}$ is substantially prevented). Once gain selector 26 has applied the selectable gain to the audio signal, it may communicate the audio signal to DACs 14A and 14B.

A voltage reference block 20 may generate the voltage reference signal indicative of the power supply voltage $V_{DDA}$. For example, the voltage reference signal may be a fraction (e.g., one-half) of the power supply voltage $V_{DDA}$. Voltage reference block 20 may be implemented in any suitable manner, including without limitation the voltage reference circuits disclosed in U.S. Pat. No. 8,390,493.

Accordingly, audio IC 10 may implement a pre-amplifier stage (e.g., comprising gain selector 26 and each of DACs 14A and 14B) powered from a first power supply ($V_{DDA}$) that applies a selectable gain to an audio input signal to generate a pre-amplified analog audio signal. In some embodiments, the pre-amplifier may include a digital gain stage (e.g., gain selector 26) for applying the selectable gain to the audio input signal to generate a gain-compensated digital audio signal and a digital-to-analog conversion circuit (e.g., DACs 14A-14B) for converting the gain-compensated digital audio signal to the pre-amplified analog audio signal, as shown in FIG. 2. In other embodiments, the pre-amplifier stage may comprise an analog pre-amplifier applying an analog gain to an analog audio input signal. Audio IC 10 may also implement an amplifier for amplifying the pre-amplified analog audio signal to generate the analog audio signal, wherein the amplifier is powered from a second power supply ($V_{CP}$) isolated from the first power supply. In addition, audio IC 10 may implement a gain selector (e.g., gain selector 26) for selecting the selectable gain based on a level of the first power supply. In some embodiments, the gain selector may select the selectable gain from a finite plurality of possible selectable digital gains (e.g., from look-up table 24).

Audio IC 10 is an example of a mixed-signal IC in which techniques of the present disclosure are practiced and is not intended to limit the present invention to any particular type of IC, as systems and methods described herein may be useful in many applications and many types of personal audio devices.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio device comprising:
   an electrical terminal for coupling a transducer device to the audio device;
   an audio circuit for generating an analog audio signal to the electrical terminal, the audio circuit comprising:
   a pre-amplifier stage for applying a selectable gain to an audio input signal to generate a pre-amplified analog audio signal, wherein the pre-amplifier stage is powered by a first power supply;

an amplifier for amplifying the pre-amplified analog audio signal to generate the analog audio signal, wherein the amplifier is powered from a second power supply isolated from the first power supply; and a gain selector for selecting the selectable gain based on a level of the first power supply, such that a difference between a magnitude of the second power supply and a magnitude of the analog audio signal is more than a predetermined headroom threshold voltage.

2. The audio device of claim 1, further comprising a voltage reference circuit for generating a voltage reference signal indicative of the level of the first power supply.

3. The audio device of claim 1, wherein the pre-amplifier stage comprises:

a digital gain stage for applying the selectable gain to the audio input signal to generate a gain-compensated digital audio signal; and a digital-to-analog conversion circuit for converting the gain-compensated digital audio signal to the pre-amplified analog audio signal;

wherein the audio input signal is a digital signal and the selectable gain is a digital gain.

4. The audio device of claim 3, wherein the gain selector selects the selectable gain from a finite plurality of possible selectable digital gains.

5. The audio device of claim 1, wherein the gain selector comprises a look-up table in which the level of the first power supply or a value indicative of the level of the first power supply is an input to the look-up table and the selectable gain or a value indicative of the selectable gain is an output of the look-up table based on the input.

6. The audio device of claim 1, wherein the electrical terminal is configured to couple the transducer device comprising a headset to the audio device.

7. A method comprising:

applying, by a pre-amplifier stage powered by a first power supply, a selectable gain to an audio input signal to generate a pre-amplified analog audio signal;

amplifying, by an amplifier powered from a second power supply isolated from the first power supply, the pre-amplified analog audio signal to generate an analog audio signal; and selecting the selectable gain based on a level of the first power supply, such that a difference between a magnitude of the second power supply and a magnitude of the analog audio signal is more than a predetermined headroom threshold voltage.

8. The method of claim 7, further comprising generating a voltage reference signal indicative of the level of the first power supply.

9. The method of claim 7, further comprising:

applying the selectable gain to the audio input signal to generate a gain-compensated digital audio signal;

converting the gain-compensated digital audio signal to the pre-amplified analog audio signal; and wherein the audio input signal is a digital signal and the selectable gain is a digital gain.

10. The method of claim 9, wherein selecting the selectable gain comprises selecting the selectable gain from a finite plurality of possible selectable digital gains.

11. The method of claim 7, wherein selecting the selectable gain comprises referencing a look-up table in which the level of the first power supply or a value indicative of the level of the first power supply is an input to the look-up table and the selectable gain or a value indicative of the selectable gain is an output of the look-up table based on the input.

12. The method of claim 7, wherein the analog audio output is configured to couple to a headset.

13. An integrated circuit comprising:

a pre-amplifier stage for applying a selectable gain to an audio input signal to generate a pre-amplified analog audio signal, wherein the pre-amplifier stage is powered by a first power supply;

an amplifier for amplifying the pre-amplified analog audio signal to generate an analog audio signal coupled to an electrical terminal for coupling a transducer device to the integrated circuit, wherein the amplifier is powered from a second power supply isolated from the first power supply; and a gain selector for selecting the selectable gain based on a level of the first power supply, such that a difference between a magnitude of the second power supply and a magnitude of the analog audio signal is more than a predetermined headroom threshold voltage.

14. The integrated circuit of claim 13, further comprising a voltage reference circuit for generating a voltage reference signal indicative of the level of the first power supply.

15. The integrated circuit of claim 13, wherein the pre-amplifier stage comprises:

a digital gain stage for applying the selectable gain to the audio input signal to generate a gain-compensated digital audio signal;

a digital-to-analog conversion circuit for converting the gain-compensated digital audio signal to the pre-amplified analog audio signal; and wherein the audio input signal is a digital signal and the selectable gain is a digital gain.

16. The integrated circuit of claim 15, wherein the gain selector selects the selectable gain from a finite plurality of possible selectable digital gains.

17. The integrated circuit of claim 13, wherein the gain selector comprises a look-up table in which the level of the first power supply or a value indicative of the level of the first power supply is an input to the look-up table and the selectable gain or a value indicative of the selectable gain is an output of the look-up table based on the input.

18. The integrated circuit of claim 13, wherein the electrical terminal is configured to couple the transducer device comprising a headset to the audio device.

* * * * *